United States Patent [19]

De La Moneda et al.

[11] 4,102,733
[45] Jul. 25, 1978

[54] TWO AND THREE MASK PROCESS FOR IGFET FABRICATION

[75] Inventors: Francisco H. De La Moneda, Reston; Harish N. Kotecha, Manassas, both of Va.

[73] Assignee: International Business Machines Corporation, Armonk, N.Y.

[21] Appl. No.: 792,278

[22] Filed: Apr. 29, 1977

[51] Int. Cl.² .............................................. H01L 21/22
[52] U.S. Cl. ..................................... 156/653; 29/571; 29/578; 29/590; 148/187; 156/656; 156/657; 357/23; 357/59
[58] Field of Search ............... 156/653, 656, 657, 662, 156/644; 148/187; 29/590, 571, 578; 357/23, 59

[56] References Cited

U.S. PATENT DOCUMENTS

| | | | |
|---|---|---|---|
| 3,652,908 | 3/1972 | MacRae et al. | 357/23 |
| 3,750,268 | 8/1973 | Wang | 29/571 |
| 3,847,687 | 11/1974 | Davidsohn | 148/187 |
| 3,921,282 | 11/1975 | Guidry et al. | 29/571 |
| 4,016,587 | 4/1977 | De La Moneda | 357/59 |
| 4,041,518 | 8/1977 | Shimizu et al. | 357/59 |

OTHER PUBLICATIONS

TSANG, "Forming . . . Barrier" *IBM Technical Disclosure Bulletin*, vol. 19 No. 9 (1977), pp. 3383-3385

*Primary Examiner*—William A. Powell
*Assistant Examiner*—Jerome W. Massie
*Attorney, Agent, or Firm*—John E. Hoel

[57] ABSTRACT

Semiconductor wafer processes employing two and three masks are disclosed for fabricating a plurality of insulated gate field effect transistors (IGFETs) to be used singly as discrete devices or interconnected as integrated circuits on the wafer by means of diffused regions at a first level and a composite of polysilicon and metal silicide layers at a second level. The first mask of the two-mask process is used in opening windows through a thick oxide layer covering the wafer for the gate and diffused regions including the source and drain regions. After forming a thin oxide layer in these windows, the wafer is coated with successive layers of polysilicon and silicon nitride. Then, a second masking operation yields a pattern out of the polysilicon-nitride layer including gate electrodes and a top-lying interconnection level which abuts to openings etched through the thin oxide layer. Doping impurities are diffused therethrough to form source and drain regions and crossunders. After etching the nitride layer a silicide forming metal is deposited and sintered to form a silicide layer on all exposed silicon surfaces lowering the sheet resistance of the polysilicon layer and joining the interconnection pattern with the source and drain regions. The process is completed by removing the remaining unreacted metal using a maskless aqua regia etch.

13 Claims, 15 Drawing Figures

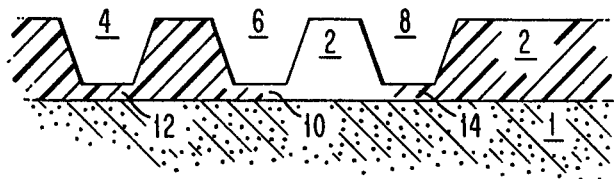
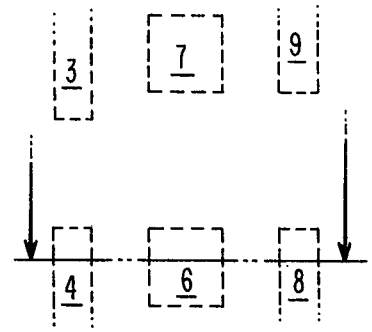
FIG. 1A
FIG. 1B
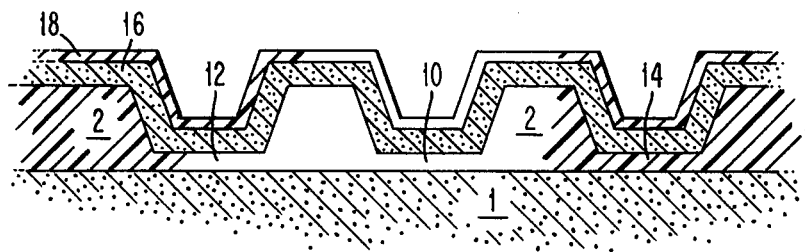
FIG. 2
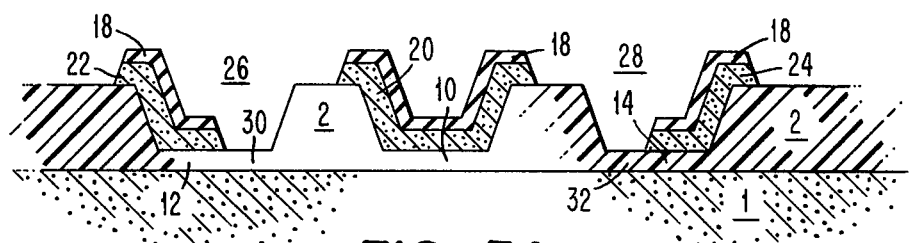
FIG. 3A
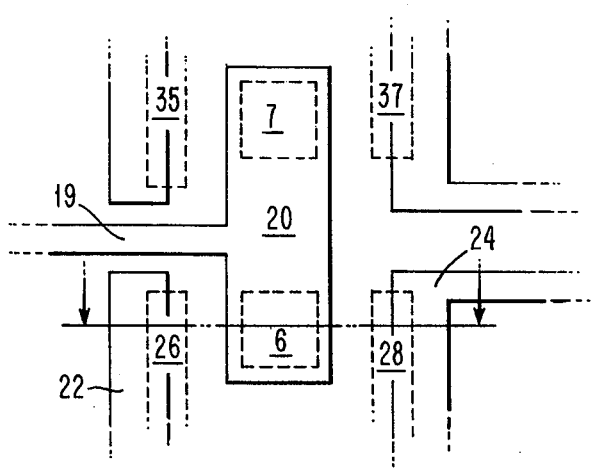
FIG. 3B

TWO AND THREE MASK PROCESS FOR IGFET FABRICATION

FIELD OF THE INVENTION

The invention disclosed relates to semiconductor device processing and more particularly relates to processing techniques for the formation of IGFET devices.

BACKGROUND OF THE INVENTION

IGFET technology has become the favorite choice for those LSI applications where low cost is an overriding consideration. Relative to the expensive bipolar transistor technology, a lesser number of masking and processing steps are necessary to fabricate an array of interconnected IGFETs. This simplicity is partly due to the self-isolation feature of IGFETs not found in bipolars. In addition to reducing overhead costs, a low mask count implies a reduction of photolithographic operations and associated photo defects and thereby higher manufacturing yields are obtained. In short, there exists strong economic incentives to justify means reducing the mask count used for semiconductor wafer processing and, in particular, for IGFET fabrication. In connection with this, self-alignment features of a process reduce the area of device elements formed thereby since positioning tolerances are reduced. Device density also determines yield. As device density increases with a constant defect probability, yield per wafer increases. One way to increase device density is by having self-alignment between different regions of the device, a feature that naturally follows when a reduced number of masking steps is used in the definition of the device regions.

The most widely used IGFET processes of the prior art; aluminum and polysilicon gate, both use four masking steps in their simplest form. The aluminum gate process exemplifies well these steps: a first mask to define windows for source, drain and a first level interconnection pattern; a second mask to define gate and contact shapes; a third mask to open contacts and a fourth mask to pattern gate electrodes and a second metallized interconnection level.

A three-mask process has been proposed in the prior art by F. H. De La Moneda, "Three-Mask Self-Aligned IGFET Fabrication Process," U.S. Pat. No. 3,958,323, which eliminates the need for a contact opening mask by using two dielectric layers, one of which can be preferentially etched with respect to the other. It requires that the contact to the semiconductor substrate be made on the back side of the chip. Consequently, chips made by this process are not suitable for flip-chip packages which require that all contacts be on a single side. The three-mask process disclosed herein fabricates all contacts on a single side.

OBJECTS OF THE INVENTION

It is therefor an object of the invention to reduce the number of masking steps used by the prior art to fabricate IGFETs.

It is still another object of the invention to simplify the processing steps used by the prior art to fabricate a plurality of IGFETs interconnected to form arrays of circuits.

SUMMARY OF THE INVENTION

These and other objects, features and advantages of the invention are accomplished by the two-mask and three-mask IGFET processes disclosed herein.

The two-mask process employs the steps of: (1) using a first masking-etching operation to open windows in the silicon oxide layer initially formed on the semiconductor wafer. These windows locate gates and areas where a subsequent diffusion will form regions for source, drain and crossunders; (2) reforming a thin oxide layer in said windows and coating the wafer with successive layers of polysilicon and silicon nitride; (3) using a second masking-etching operation to etch out of the nitride-polysilicon layer patterns for the gate electrode and an interconnection grid. The thin oxide regions not covered by this pattern are etched to produce holes aligned with respect to the adjacent interconnection layer and to expose the surface of the semiconductor substrate; (4) diffusing doping impurities through the exposed surface to form diffused regions which serve as source and drain and as crossunders when regions corresponding to adjacent windows merge; (5) removing the remaining portions of the silicon nitride layer; (6) coating the wafer with a silicide forming metal; (7) sintering the metal layer to form a silicide coating on all polysilicon surfaces and on exposed areas of the source and drain regions, thereby joining them with the silicide-polysilicon interconnection level; (8) selectively etching the unreacted portions of the metal.

The three-mask process employs the steps of: (1) using a first masking-etching operation to open windows in the silicon oxide layer initially formed on a semiconductor wafer which leaves exposed regions to be used as source, drain or a first-level interconnection; (2) diffusing through these windows doping impurities to form regions therein of polarity opposite to the substrate and enhanced conductivity while simultaneously reforming the oxide layer in the windows; (3) using a second masking-etching operation to open windows for the gate and contacts to the diffused regions and semiconductor substrate; (4) forming a thin oxide layer in the gate and contact windows; (5) depositing a layer of polysilicon on the wafer; (6) using a third masking-etching operation to etch a pattern out of said polysilicon layer comprising gate electrodes and a second level interconnection grid which encompasses contact holes which are etched through the thin oxide left exposed by the removed polysilicon, thereby aligning the polysilicon interconnections with the contact holes; (7) coating the wafer with a silicide forming metal layer; (8) sintering the metal layer to form a silicide coating on all polysilicon surfaces and on exposed areas of the substrate, source and drain regions and (9) selectively etching the unreacted portions of the metal layer. Thus, arrays of IGFET devices can be formed and interconnected at a first level in the semiconductor wafer and at a second level above the semiconductor surface. The sintering of the metal layer forms a sufficiently thick silicide coating on the substrate surfaces exposed through the contact holes to join the first and second interconnection levels. All contacts, including those to the substrate, are located on a single side of the wafer.

DESCRIPTION OF THE FIGURES

These and other objects, features and advantages of the invention will be more particularly appreciated with reference to the accompanying figures.

FIGS. 1a, 2, 3a, 4a, 5, 6 and 7 illustrate cross-sectional views at various stages during the fabrication of IGFETs in accordance with the disclosed two-mask process. FIGS. 1b, 3b and 4b illustrate plan views of their corresponding cross-sectional view at successive stages of the fabrication of IGFETs in accordance with the two-mask process.

FIG. 1a illustrates a cross-sectional view for an IGFET after a first masking operation and subsequent gate oxide growth.

FIG. 1b is a plan view of a pair of IGFETs including the IGFET of FIG. 1a.

FIG. 2 illustrates a cross-sectional view after deposition of successive layers of polysilicon and nitride.

FIG. 3a illustrates a cross-sectional view after the second masking operation.

FIG. 3b is a plan view including the IGFET of FIG. 3a.

FIG. 4a illustrates a cross-sectional view obtained after the diffusion operation.

FIG. 4b shows a plan view of a pair of IGFETs including the IGFET of FIG. 4a.

FIG. 5 illustrates a cross-sectional view after the deposition of a platinum layer.

FIG. 6 illustrates a cross-sectional view of the device of FIG. 5 after a platinum silicide layer is formed and the remaining platinum is etched away.

FIG. 7 illustrates a cross-sectional view of the device of FIG. 6, modified to further include a second level of interconnection metal.

FIG. 8 shows the cross section of the device after a first masking-etching operation on the thick oxide.

FIG. 9 shows the cross section of the device after a second masking-etching operation to locate the gate, source and drain.

FIG. 10 shows the cross section of the device after a polysilicon layer is formed thereon.

FIG. 11 shows the cross section of the completed structure.

DESCRIPTION OF THE PREFERRED EMBODIMENT

Figure 3C:
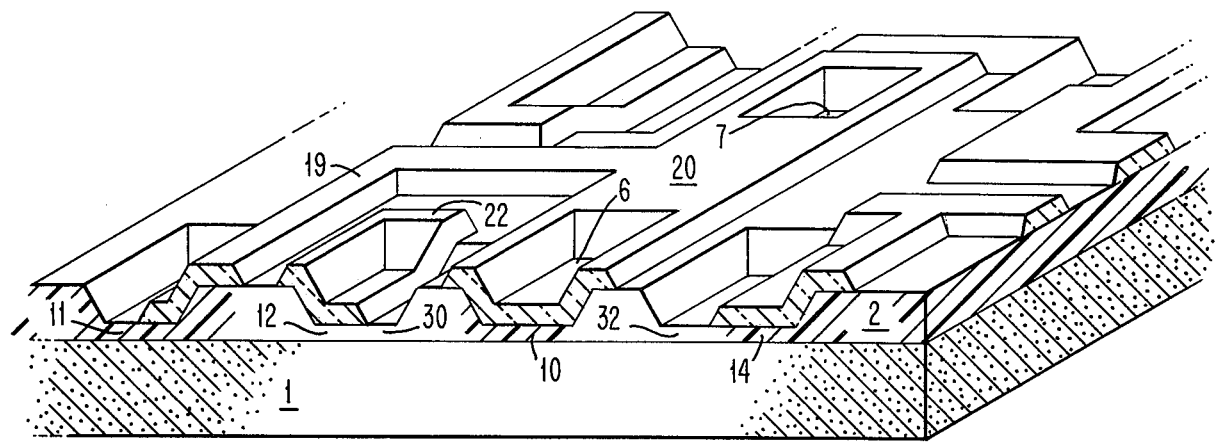
FIG. 3c is a three-dimensional view including the IGFETs shown in FIGS. 3a and 3b.

A description of the two-mask IGFET process follows. An IGFET fabrication process with only two masking steps is achieved by using a first masking-etching step to simultaneously define gate, source and drain regions and a second masking-etching step merging the operations for opening of contact holes with the formation of an interconnection pattern.

Referring to FIGS. 1a and 1b, a semiconductor substrate 1 is of a first conductivity type doping having at least one planar surface. The doping should be P type if N channel IGFETs are desired and conversely N type for P channel IGFETs. For illustrative purposes, the disclosure herein is directed towards fabricating N channel IGFETs; however, it is recognized that the disclosed techniques can also be applied to the fabrication of P channel IGFETs. A suitable doping density for the substrate is $5 \times 10^{15}$ cm$^{-3}$. A thick layer 2 of silicon oxide is grown on the surface of the semiconductor substrate to about 6500 Angstroms by means of thermal oxidation or other methods well known in the art.

A first mask is next used with conventional photolithographic and etching techniques to open windows 4, 6 and 8 for the source, gate and drain regions, respectively. An alternative technique starts by successively forming layers of silicon oxide and nitride on the wafer. A first mask is then used such that subsequent etching leaves nitride portions wherever windows 4, 6 and 8 are desired. These nitride portions function as oxidation masks which localize the growth of the thick oxide layer 2 to the field regions of the structure. With this alternative technique, the threshold voltage of the field region can be raised by a pre-oxidation blanket implant of p-type ions blocked out from gate, source and drain regions by the nitride layers. In either approach, these windows must expose the surface of the substrate 1 so that gate-quality thin oxide layers can be grown therein, with layer 10 eventually forming the gate structure and layers 12 and 14 covering the regions wherein source and drain regions are to be formed. In order to stabilize both thin and thick oxide, a thin layer of phosphosilicate glass (PSG) is deposited during the growth of the thin oxide layer. A blanket ion-implant can be performed at this stage to adjust the threshold voltage associated with layer 10.

FIG. 2 shows a layer of polysilicon 16 disposed over the entire surface. This layer does not have to be excessively thick or heavily doped since its sheet resistance will be lowered by the subsequent formation of a metal silicide layer. A thickness in the range from 2000 Angstroms to 5000 Angstroms suffices. Thereafter, another layer 18, suitable for a diffusion or ion-implantation mask, is deposited such as silicon nitride. Clearly, the thickness of layer 18 depends on its use, masking ion-implantation calling for the largest thickness of about 2000 Angstroms. Both layers 16 and 18 can be deposited by a number of methods such as chemical vapor deposition, evaporation or sputtering which are well known in the art and a detailed discussion of which is not deemed necessary. The wafer is then ready for a second masking and associated etching operations.

If conventional wet methods are used to etch the aforementioned layers 16 and 18, an additional top-lying oxide layer to function as an etching mask during the stripping of nitride layer 18 is needed to avoid photoresist adhesion problems. These problems are eliminated if plasma or reactive ion etching methods are used. For convenience, these methods will be referred to as dry etching. This technique not only simplifies the process of etching nitride layer 18 and polysilicon layer 16 but also produces minimal undercutting. The latter feature is of interest to the disclosed invention to prevent the formation of voids when contacts are made to diffused regions by replacing the etched layers 12 and 14 with a silicide layer. Thus, dry etching is preferably used after the second masking operation. The second masking produces a pattern on a top lying photoresist layer, not shown in FIG. 3a. The pattern is disposed over the field regions and extends over regions 4, 6 and 8 which are completely encompassed if they are to become part of gate regions or partially overlapped if they are located over intended source and drain regions. With this photoresist pattern covering nitride layer 18, the wafer is ready for placement in a vacuum chamber where a flourine based plasma etches both the nitride layer 18 and the polysilicon layer 16. The remaining double-layered pattern is shown in FIGS. 3a and 3b as forming gate electrode 20 and interconnections 22 and 24. This pattern can be better appreciated by referring to FIG.

3c where for the sake of clarity the nitride layer 18 is not shown. The interconnection line 19 partially covers the thin oxide layer 11, overlying a portion of the substrate wherein a drain region will be formed, and extends over the thick oxide layer 2 to form the gate electrode 20 of the two adjacent devices defined by gate regions 6 and 7.

The intersection of interconnection lines 22 and 24 with the thin oxide regions 12 and 14 respectively define windows 26 and 28 shown in FIG. 3b. Doping impurities are subsequently deposited through windows 26 and 28 and silicide contacts are formed therein, afterwards.

Figure 4A:
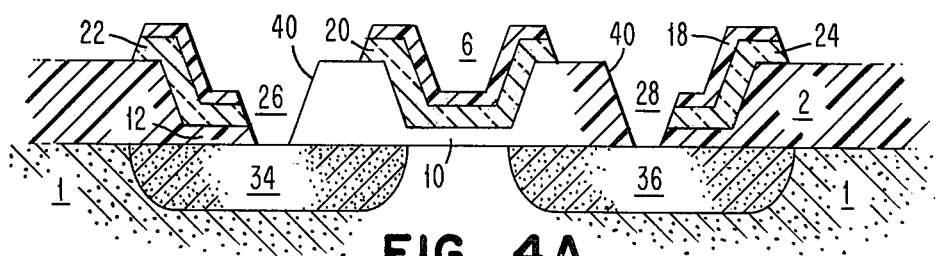
Figure 4B:
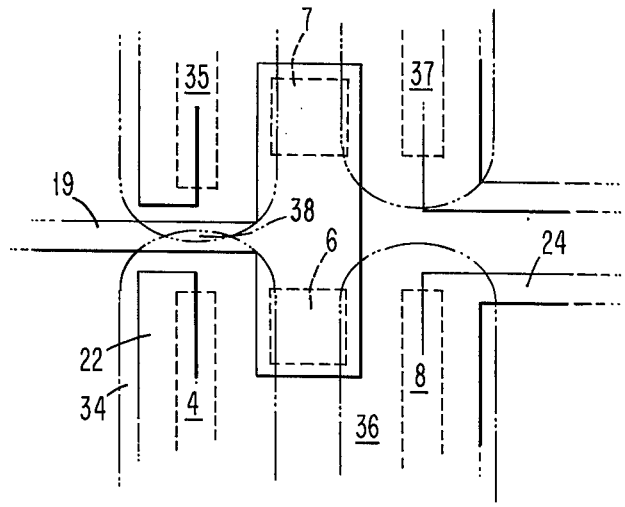
Figure 5:
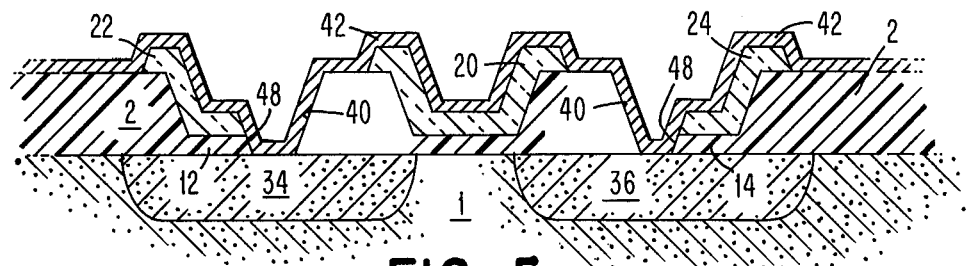
Figure 6:
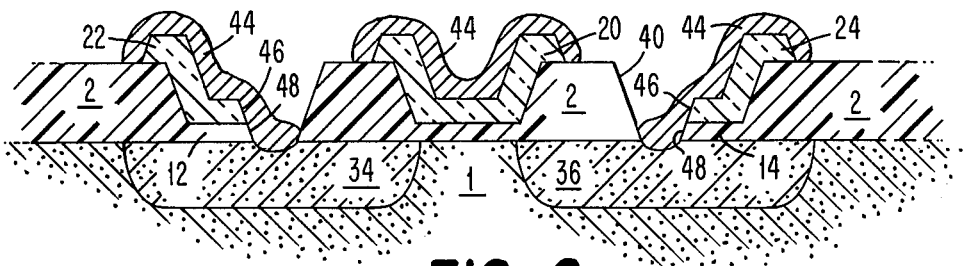

The unmasked thin oxide regions 30 and 32 are first stripped by dry etching if the doping impurities for the subsequent diffusion are deposited by thermal means. If they are ion-implanted, it is advantageous to keep layers 30 and 32 to minimize the occurrence of channeling. After deposition of n-type impurities, a drive-in cycle forms source regions 34 and 35, drain regions 36 and 37 and crossunder 38 which are shown by FIGS. 4a and 4b. Crossunders such as 38 are formed by merging the nearest edges of at least two adjacent diffused regions. Thus, crossunder 38 is formed by merging the nearest edges of the diffused source regions 34 and 35. The availability of diffused crossunders enhances the wiring density of the top-lying interconnection grid by permitting the layout of lines along intercepting directions as illustrated by lines 19 and 22 of FIGS. 3b and 3c. A crossunder must be long enough to accommodate about twice the minimum pitch used to layout minimum width polysilicon lines. This pitch is mainly determined by photolithographic resolution and etching tolerances. For a dry-etched 2.5-micrometer-wide line such as 19, the diffused regions 34 and 35 must be driven in to a depth between 5 and 6 micrometers to form crossunder 38 and overlap the nearest edges of the gate thin oxide region 10. The first mask positions gate region 6 with respect to source and drain windows 4 and 8 and gate region 7 with respect to source and drain windows 3 and 9 so that a minimum overlap is obtained between layer 10 and regions 34 and 36. The drive-in cycle is done in a nonoxidizing ambient to avoid growing a thick oxide layer on the exposed polysilicon sidewalls 40 and contact regions 26 and 28. Next, all of the remaining nitride layer 18 and doped glass and/or oxide layers covering contact windows 26 and 28 are respectively etched using warm phosphoric acid and reactive plasma. The wafer is now ready for deposition of a layer of silicide forming metal such as platinum, palladium or hafnium at least twice as thick as the thin oxide layers 12 and 14. Any one of the well known methods such as electron beam or filament evaporation can be used to deposit metal layer 42 as shown in FIG. 5, which is then annealed sufficiently long at the temperature required to completely transform the original metal layer 42 into a stable platinum silicide layer 44. As FIG. 5 shows, since the metal layer 42 is thicker than the thin oxide layers 12 and 14, a silicide layer 44 in FIG. 6 is obtained which bridges the gap between the surface of the source-drain regions 34 and 36 and the polysilicon sidewalls 46. Formation of voids between silicide layer 44 and the thin oxide sidewalls 48 is prevented by using dry-etching techniques which produce little undercutting of the thin oxide layers 12 and 14. Preferred metals for layer 42 are platinum, palladium and hafnium since their reactions with silicon are self-limited to the exposed silicon surfaces, leaving unreacted the portion of the metal layer 42 covering exposed oxide surfaces 40. A 1000 Angstrom thick platinum layer requires annealing at 700° C for 15 minutes to form a 2000 Angstrom thick platinum silicide layer. The unreacted metal covering the thick oxide layer 2 is then removed by a maskless etch in hot aqua regia which does not attack oxide layer 2 or silicide layer 44. The sheet resistance of the polysilicon lines is reduced down to the range between 1 and 4 ohms per square. The completed device structure with interconnections is shown in FIG. 6.

The completed structure has self-alignment features which follow from using a single mask to simultaneously define more than one device region. The first mask defines regions for the gate 6, source 4 and drain 8, so that the thin oxide gate region 10 is self-aligned with respect to the windows for the source 26 and drain 28 and the respective diffused regions 34 and 36 deposited therethrough. However, since the gate electrode 20 is defined with the second mask, some area-consuming tolerance must be allowed in order to insure its alignment with respect to the gate thin oxide region 10. Interconnections 22 and 24 are self-aligned with respect to their corresponding contact windows 26 and 28 since they are all defined by the second mask. As explained in connection with FIG. 4b, the relative position between the windows for the gate 6, source 4 and drain 8, is determined by the length of the crossunder 38 which restricts the reduction in device area that can be realized through self-alignment. These restrictions can be removed by substituting crossunders with a second interconnection level to match and surpass the wiring density obtained with the former. To realize this interconnection enhancement, the process must be expanded by two masking operations and the metal silicide layer 44 must be stable under the hot processes conventionally used to deposit an intermediate insulating layer supporting the second interconnection level. One such method is chemical vapor deposition (CVD) which calls for temperatures between 750° and 800° C. In addition, this may be followed by a phosphosilicate glass (PSG) deposition for oxide stabilization at temperatures between 750° and 900° C. Hafnium and platinum silicide have been shown to be stable for annealing cycles at these temperatures.

Figure 7:
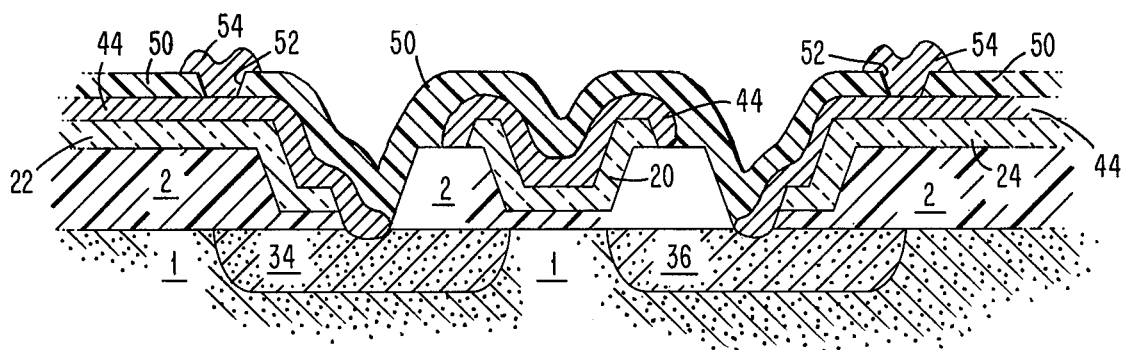

The structure of FIG. 7 has been fabricated following the steps leading to FIG. 6, except that merged diffusions have not been used to form crossunders. The process is then continued by forming a layer 50 of CVD oxide over the wafer and toped by PSG. A third mask is used with conventional etching to open via holes 52 which expose the silicide layer 44 wherever it is to be contacted by the second interconnection level. Next, a low temperature deposition is made to form an aluminum layer which comes into contact with silicide layer 44 through via holes 52. A subetch operation then yields a second interconnection level pattern 54. The process is completed with the usual aluminum annealing.

The structure of FIG. 7 possesses two features which promote the efficient use of wafer area. First, the absence of crossunders permits full utilization of self-alignment between source, gate and drain windows to reduce device area and second, the silicide layer 44 lowers the sheet resistance of polysilicon lines 16 by at least a decade so that first level interconnection lines can be made narrower than the plain polysilicon lines used by the prior art. These features can be employed by efforts directed toward reducing device size and interconnection linewidths; goals which lead to both high circuit density and manufacturing yield.

Another approach to enhancing device and wiring density of the structure of FIG. 6 is to use continuous diffused lines for a first interconnection level instead of crossunders. This approach requires modifications of the two-mask process revolving around the addition of one extra mask; hence it is referred to as the three-mask process. The following description of the preferred embodiment primarily dwells upon the dissimilarities between the two processes. To emphasize their similarities the numeral designations are repeated except for distinguishing primes.

Figure 8:
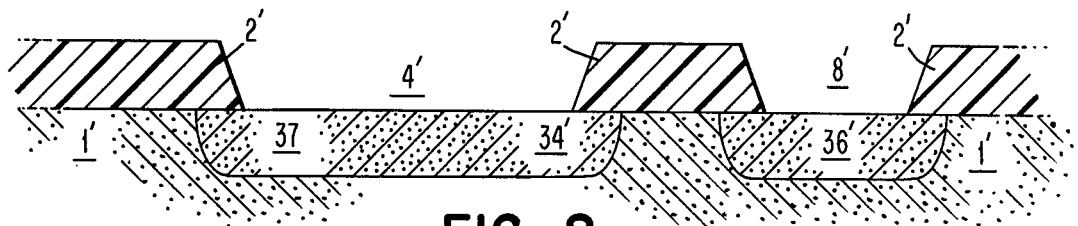
FIGS. 8 through 11 illustrate the three-mask embodiment of the inventive process.
Figure 9:
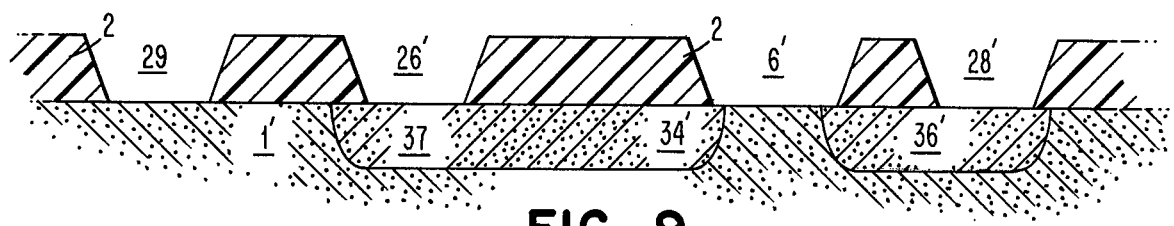
Figure 10:
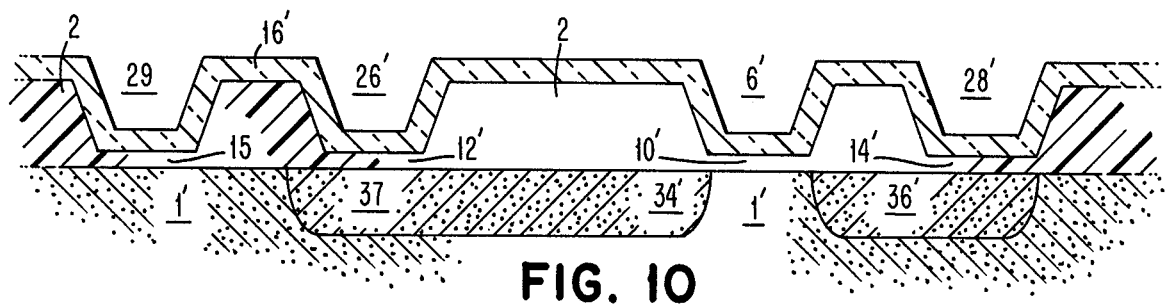
Figure 11:
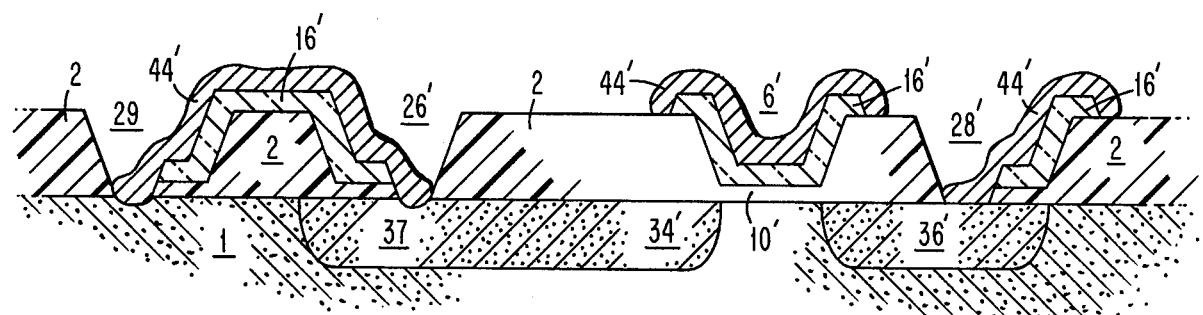

The additional mask is used for a first masking-etching operation on the thick oxide layer 2' which yields the structure of FIG. 8. This structure has windows 4' and 8' which define source and drain regions, as in FIG. 1. However, window 4' defines in addition to a source, a first level interconnection pattern as will become apparent in FIG. 10. These windows expose the substrate 1' for the deposition thereon of n-type impurities which are then thermally driven in to form source, drain and interconnection regions 34', 36' and 37, respectively. Simultaneously with this drive-in cycle, the oxide is reformed in the openings 4' and 8' to obtain a planar surface as discussed by U.S. Pat. No. 3,899,372 assigned to the same assignee as that of the present invention. Next, a second masking operation is used in conjunction with conventional etching techniques to open the windows shown in FIG. 9 which locate the gate region 6' and contact windows 26' and 28' for the source and drain, respectively. In addition, a contact window 29 for the substrate 1' can also be opened, an option not available with the two-mask process. In FIG. 10, layers of thin oxide 10', 12', 14' and 15 are respectively grown in these openings followed by the deposition of polysilicon layer 16' over the wafer. Since all required diffused regions have already been formed, nitride layer 18 of the two-mask process can be dispensed with. At this stage of the process, the structure of FIG. 10 is about equivalent to that of FIG. 2a for the two-mask process except for the absence of diffused regions in the latter. It follows then that the remaining process steps, leading to a second interconnection level consisting of polysilicon-silicide lines and gate electrodes, are the same as those used for the two-mask process. The completed structure is shown in FIG. 11.

Because of the additional masking step, the gate region 10' is not self-aligned with respect to windows for the source 4' and the drain 8', as in the two-mask case. However, self-alignment between the silicide-polysilicon lines and contact holes to the diffused drain region 36' and interconnection level 37 is preserved.

While the invention has been particularly shown and described with reference to the preferred embodiment thereof, it will be understood by those skilled in the art that the foregoing and other changes in form and details may be made therein without departing from the spirit and scope of the invention.

We claim:

1. A process for fabricating an IGFET device, comprising:
   masking with a first mask and etching to define gate, source and drain openings in a thick insulating layer on a silicon semiconductor substrate;
   coating all exposed surfaces with successive layers of thin insulating material and polysilicon;
   masking with a second mask and etching said polysilicon and thin insulating layer in said source and drain regions and dip etching to remove said thin insulating material polysilicon composite layer therein;
   introducing a conductivity enhancing dopant in the exposed source and drain regions;
   coating all exposed surfaces with a silicide forming metal layer;
   sintering said metal layer to form a silicide coating on said polysilicon layer in the gate region to form a gate electrode and on the exposed silicon in the source and drain regions to form source and drain contacts;
   preferentially etching the unreacted portions of said metal layer;
   whereby an IGFET device is fabricated.

2. The process of claim 1, wherein said silicide forming metal is selected from the group consisting of platinum, palladium and hafnium.

3. The process of claim 1, wherein said silicide forming metal is platinum.

4. The process of claim 1, wherein said second masking step includes the definition of polysilicon interconnection lines on said thick insulating layer, which are converted to a metal silicide during said sintering step.

5. The process of claim 4, wherein said polysilicon interconnection lines extend to the edge of said source and drain regions.

6. The process of claim 5, wherein said metal silicide formed in the portions of the silicon substrate exposed in said source and drain regions electrically contacts the metal silicide formed on said polysilicon lines.

7. The process of claim 1, which further comprises the step, following said step of preferentially etching the unreacted portions of said metal layer, of:
   depositing a second insulating layer over all exposed surfaces;
   forming via holes in said second insulating layer over selected portions of said silicide coating;
   depositing a second metal layer over said second insulating layer and said via holes;
   etching said second metal layer to form a second level of interconnection lines which selectively and electrically connect with said silicide coating through said via holes.

8. The process of claim 1, wherein said thick and thin insulating layers are composed of a silicon oxide.

9. A two-mask process for fabricating an IGFET device, comprising:
   masking with a first mask and etching to define gate, source and drain openings in a thick oxide layer disposed on a silicon semiconductor substrate wafer;
   coating a layer as thin oxide in said openings;
   coating all surfaces with successive layers of polysilicon and silicon nitride;
   masking with a second mask and etching said polysilicon and nitride layers to form gate electrodes and interconnection patterns disposed on said thin and thick oxide layers, leaving portions of said thin oxide uncovered to define source and drain contact windows;
   exposing portions of said substrate by etching said uncovered thin oxide to form openings whose edges are self-aligned with respect to said interconnection line disposed on the remaining portion of thin oxide;

depositing doping impurities of polarity opposite to the substrate through said windows to form diffused regions for source and drain and crossunders composed of laterally merged diffused regions;

etching all of the remaining silicon nitride layer and coating all surfaces with a layer of silicide forming metal thicker than said remaining portions of thin oxide;

sintering said metal layer to form a silicide coating on said polysilicon gate electrode, interconnection pattern and on the portions of the source and drain regions exposed by said windows whereby the portion of the interconnection patterns disposed on the remaining thin oxide layer contacts said exposed portion of said substrate.

10. A three-mask process for fabricating an IGFET device, comprising the steps of:

masking-etching to open windows in a silicon oxide layer initially formed on a semiconductor water, leaving exposed regions to be used as source, drain or a first-level interconnection;

diffusing through said windows doping impurities to form regions therein of polarity opposite to the substrate and enhance conductivity while simultaneously reforming the oxide layer in said windows;

masking-etching to open windows for the gate and contacts to the diffused regions and semiconductor substrate;

forming a thin oxide layer in said gate and contact windows;

depositing successive layers of polysilicon and silicon nitride on the wafer;

masking-etching to etch a pattern out of said double layer polysilicon and silicon nitride comprising gate electrodes and a second level interconnection grid which encompasses the contact holes opened through the thin oxide left exposed by the removed nitride-polysilicon, thereby aligning the polysilicon connection with the contact hole;

etching to remove the nitride layer;

coating the water with a silicide forming metal layer;

sintering the metal layer to form a silicide coating on all polysilicon surfaces and on exposed areas of the source and drain regions; and preferentially etching the unreacted portions of the metal layer;

whereby arrays of IGFET devices can be formed and interconnected at a first level in the semiconductor wafer and a second level above the semiconductor surface.

11. The process of claim 10, wherein said silicide forming metal is selected from the group consisting of platinum, palladium and hafnium.

12. The process of claim 10, wherein said silicide forming metal is platinum.

13. The process of claim 10, which further comprises the step, following said step of preferentially etching the unreacted portions of said metal layer, of depositing a second insulating layer over all exposed surfaces;

forming via holes in said second insulating layer over selected portions of said silicide coating;

depositing a second metal layer over said second insulating layer and said via holes;

etching said second metal layer to form a second level of interconnection lines which selectively and electrically connect with said silicide coating through said via holes.

* * * * *